United States Patent
Das et al.

[11] Patent Number: 5,978,690
[45] Date of Patent: Nov. 2, 1999

[54] REDUCING POWER CONSUMPTION IN LOW NOISE RADIOPHONE AMPLIFIERS

[75] Inventors: Sukla R. Das, Red Bank; Emanuil Y. Shvarts, Somerville, both of N.J.

[73] Assignee: Lucent Technologies Inc., Murray Hill, N.J.

[21] Appl. No.: 08/805,002

[22] Filed: Feb. 25, 1997

[51] Int. Cl.$^6$ .............................. H04B 7/00; H04B 1/16; H04L 27/08

[52] U.S. Cl. .................... 455/574; 455/38.3; 455/343; 375/345

[58] Field of Search .................... 455/574, 38.3, 455/343, 226.1, 226.2, 127, 333, 232.1, 234.1, 239.1, 249.1, 252.1, 219, 220, 233.1, 572; 375/345

[56] References Cited

U.S. PATENT DOCUMENTS

| | | | |
|---|---|---|---|
| 3,577,103 | 5/1971 | Sparks | 333/17 |
| 4,754,233 | 6/1988 | Pickett | 330/311 |
| 4,977,611 | 12/1990 | Maru | 455/161 |
| 5,001,776 | 3/1991 | Clark | 455/226 |
| 5,129,098 | 7/1992 | McGirr et al. | 455/69 |
| 5,442,345 | 8/1995 | Kwon | 340/825 |

*Primary Examiner*—Wellington Chin
*Assistant Examiner*—Sheila Smith

[57] ABSTRACT

The battery life of a portable radiotelephone is increased by providing a variable instead of a fixed value of collector-emitter current for the low noise transistor in the RF receiving stage. In particular, the collector current of the RF receiving stage is microprocessor controlled in inverse proportion to the strength of the received signal, an indication of which is advantageously taken from the normally provided "RSSI" output signal provided by the radiotelephone set's conventional IF chip. The microprocessor stores an indication of the correct amount of base current drive to be supplied to the RF transistor to determine its collector current for strong signal and weak signal conditions as well as monitoring collector current for varying base drive to compensate for temperature effects.

9 Claims, 1 Drawing Sheet

Fig. 1
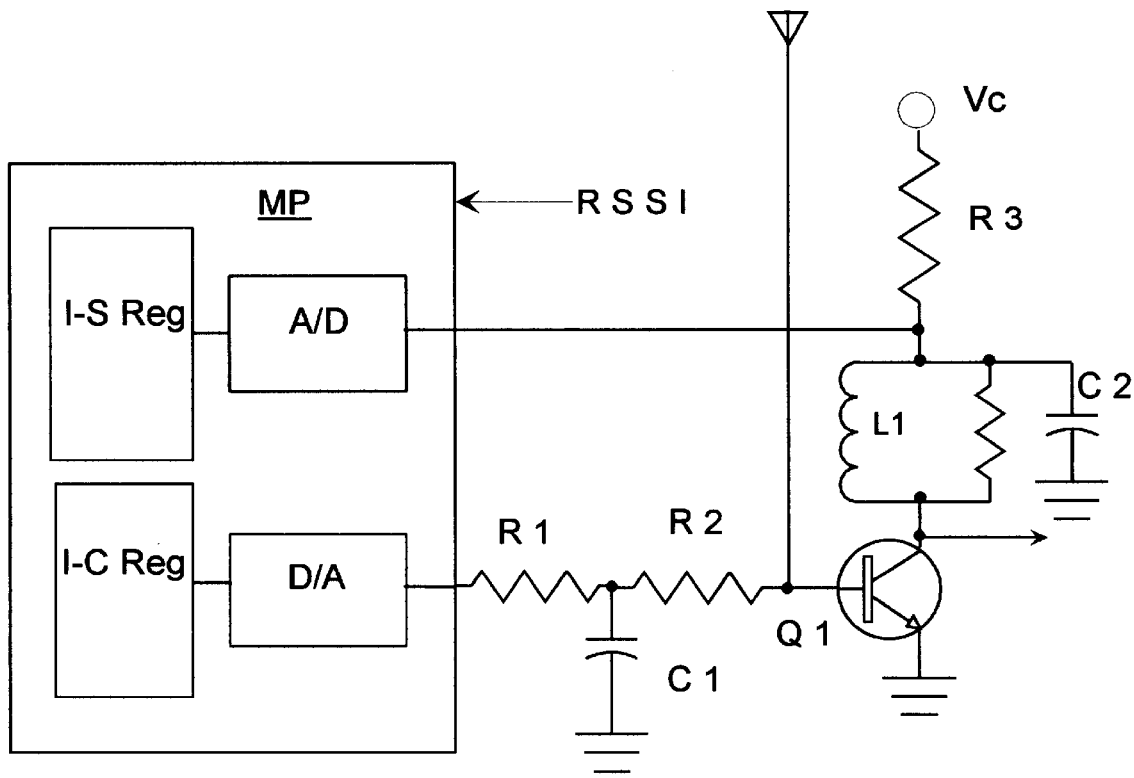
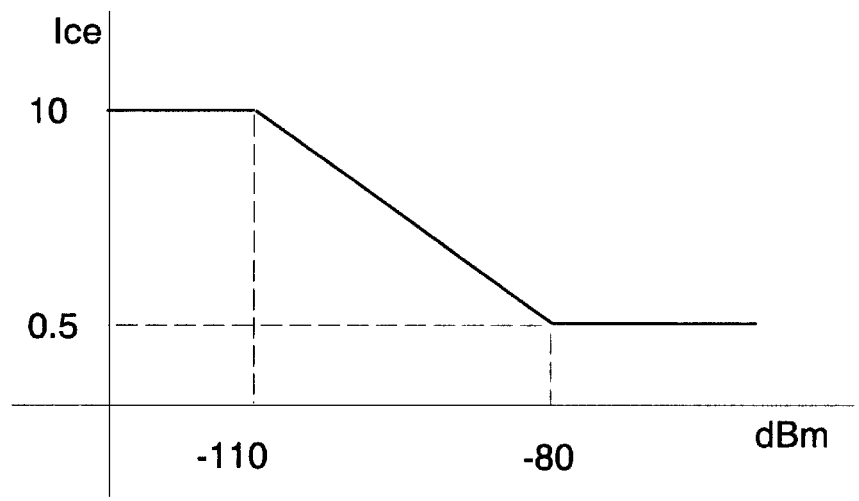
Fig. 2

REDUCING POWER CONSUMPTION IN LOW NOISE RADIOPHONE AMPLIFIERS

FIELD OF THE INVENTION

This invention relates to power-conserving radio phone systems and, more particularly, to low noise radio frequency amplifiers for use in such systems.

BACKGROUND OF THE INVENTION

Because the typical portable radiotelephone used in a cellular system is battery powered, low current drain is an important factor in circuit design to achieve acceptable operating and standby times. The receiver portion of the radiotelephone preferably employs low noise transistors and special care is taken in circuit layout to minimize noise input. In addition, the receiver is expected to perform satisfactorily over a wide range of RF signal strengths, typically from −116 dBm for the weakest signal to −30 dBm for the strongest signal. To achieve low noise operation with weak RF signals at frequencies of 800 MHZ and above, a comparatively high level of RF stage collector-emitter current Ice, perhaps as much as 10–15 mA DC, may be necessary to achieve an acceptable signal to noise ratio. This level of collector-emitter current is an appreciable fraction of total RF current which is required to be less than 25–35 mA in the analog standby state. It would be extremely desirable to be able to prolong battery life by reducing the amount of RF stage collector-emitter current during standby periods.

SUMMARY OF THE INVENTION

In accordance with the principles of the invention, in one illustrative embodiment thereof, the battery life of a portable cellular telephone is increased by providing a variable instead of a fixed value of collector-emitter current for the low noise transistor in the RF receiving stage. In particular, the base drive for the RF receiving stage is controlled in inverse proportion to the strength of the received signal an indication of which may, advantageously, be taken from the normally provided "RSSI" output lead of the conventionally employed IF chip of the cellular telephone. Thus, when the RF signal is weak, for example −100 dBm or less, the microprocessor increases base current drive to increase collector-emitter current to provide maximum RF gain and, conversely, when the RF signal is very strong, for example, −30 dBm, base current drive is reduced to the minimum level, such as 0.3 to 0.5 mA. Because cellular systems often provide good RF signal strength in densely populated urban service areas where, statistically, any given cellular telephone set is more often likely to be located, a considerable amount of battery current is saved if collector current is reduced when high RF gain is not required. In one illustrative embodiment of the invention, a current-control register in the microprocessor stores a digital value which value is inversely determined by the RSSI signal. A digital to analog converter converts this digital value to an analog voltage which is low pass filtered and applied to the base of the low noise input RF transistor to determine the transistor's Ice. The input RF signal from the cellular telephone antenna is applied directly to the base of this transistor in the conventional manner. To prevent the output impedance of the digital to analog converter from "short-circuiting" the RF signal, it is RF isolated from the base of the low noise transistor by a series resistor of comparatively high value. An inductor in series with the collector of the low noise transistor provides RF isolation of the collector feed resistor from the source of Vcc. The low-pass filtered voltage drop through the collector current feed resistor is monitored by an analog to digital converter and applied to a current sense register in the microprocessor. In addition, the microprocessor MP monitors the actual Ice and changes the value in the current control register to compensate for collector current variation due to temperature effects.

BRIEF DESCRIPTION OF THE DRAWING

The foregoing and other features of the present invention may become more apparent when the ensuing description is read together with the drawing in which:

FIG. 1 is a schematic diagram of a low noise, battery-saving RF transistor stage for use in a cellular telephone operating at frequencies of 800 MHZ and above, in accordance with the present invention; and FIG. 2 is a plot of the collector emitter current Ice for the embodiment of FIG. 1.

GENERAL DESCRIPTION

Referring to FIG. 1, a low noise RF input stage is shown for a cellular telephone set designed for operation at 800 MHZ and above. The RF input signal from the telephone set's antenna is applied (often through a corresponding matching circuit, not shown) to the base of grounded emitter transistor Q1. DC bias current is applied to the base of transistor Q1 from microprocessor MP through resistors R1 and R2, resistor R2 being large enough to prevent the RF signal from being shorted to ground through C1. The amount of base bias current is determined by microprocessor MP which stores a digital quantity representing the bias current value in current control register I-C. The bias current value stored in register I-C is converted to an analog voltage by digital to analog converter D/A. The amount of collector current Ice flowing through transistor Q1 is monitored by analog to digital converter A/D which senses the analog voltage drop across resistor R3 and reports the corresponding digital value to current sensing register I-S. Microprocessor MP uses the value of collector current stored in current sensing register I-S to regulate the collector current for temperature stability by modifying the bias drive number stored in current control register I-C. The amplified RF signal at the collector of transistor Q1 is kept from entering the DC supply by inductor L1 and capacitor C2. The amplified RF signal is passed (as shown by the rightward pointing arrow at the collector of transistor Q1) to subsequent intermediate frequency stages (not shown) which, among other things, employ an IF chip circuit such as the NE/SA624 manufactured by Philips and described in their 1996 publication entitled "Semiconductors for Wireless Communications", at pages 573–574. The IF chip develops an "RSSI" signal as an indication of the strength of the received RF signal. Microprocessor NP receives the received signal strength indication signal RSSI from the conventional digital integrated IF chip circuitry. The RSSI signal, which normally functions merely to advise the user as to the strength of the RF signal in the local area, is used by microprocessor MP to vary the digital quantity to be stored in current control register I-C inversely in accordance with the received signal strength reported by the RSSI signal: When the RSSI signal indicates the reception of a weak RF signal, microprocessor increases the value in control register I-C. This causes the digital to analog converter D/A to provide an increased analog current drive to the base of transistor Q1, thereby increasing the gain of the transistor for RF signals. When the RSSI signal indicates a strong RF signal microprocessor MP reduces the number stored in current control register I-C. The value of resistor R2 is determined by the voltage output provided by digital to analog converter D/A and is given by:

$$R2 = \frac{V_c * B}{I_c}$$

where Vc is the output voltage of the D/A converter (typically about 3 volts); B is the DC gain of transistor Q1 and Ic is the collector current (typically about 15 mA). Thus R2 will typically have a value of about 20,000 ohms. This resistance provides good isolation from the microprocessor for RF signals at the base of Q1; the equation above holding true for R2>>R1.

Referring now to FIG. 2, the variation in collector current with RF signal strength is shown. According to prevailing standards, cellular telephones are expected to operate with RF signals ranging from a weak signal of −116 dBm to a strong signal of −30 dBm, a very large range. On the other hand, maximum low noise amplifier (LNA) current can be provided only over a range from −100 (perhaps −105) dBm or less. Statistically, most cellular telephone sets will most often be used in a high signal strength area (greater than −105 dBm), and it is in such an area that drive current for the RF transistor can be lowered since not so much gain is required. With a lower amount of drive current provided most of the time, the standby time of the telephone set will be increased, making for longer battery life.

EXAMPLES

Typical values of circuit components in FIG. 1 for operation at 800 MHZ, are:
Capacitor C1=0.01 μF, manufactured by Murata;
Capacitor C2=100 pF, manufactured by Murata;
Inductor L=0.01 μH, manufactured by Coilcraft;
Microprocessor MP, type MC68HC 11, manufactured by Motorola;
Transistor Q1 type BFG520X, manufactured by Motorola;
Resistor R1=4700 ohms, manufactured by Hocuricu;
Resistor R2=18,000 ohms, manufactured by Hocuricu; and
Resistor R3=120 ohms, manufactured by Hocuricu.

What has been described is deemed to be illustrative of the principles of the invention. Numerous modifications will be apparent to those skilled in the art without however departing from the spirit and scope of the invention.

What is claimed is:

1. A method of conserving battery power in a portable, microprocessor controlled radiotelephone set adapted to receive an RF signal from an antenna and having a low noise RF transistor receiving stage, comprising the steps of:

a. storing in said microprocessor an indication of received RF signal strength applied to said RF transistor base; and b. providing a DC current drive to the base of said RF transistor in parallel with but isolated from said RF signal in inverse proportion to the stored RF signal strength indication.

2. A method of conserving battery power in accordance with claim 1, wherein said microprocessor senses the collector current of said transistor.

3. A method of conserving battery power in accordance with claim 1, wherein said microprocessor stores in a current control register an indication of the amount of base current drive to be supplied to said transistor.

4. A method of conserving battery power in accordance with claim 1, wherein said radiotelephone set includes an IF stage and wherein said received signal strength indication is provided to said microprocessor by said IF stage as an RSSI signal.

5. A method of conserving battery power in accordance with claim 4, wherein said microprocessor stores an indication of said sensed collector current in a current sense register.

6. A method of conserving battery power in accordance with claim 1, wherein said radiotelephone set includes an IF stage and wherein said received signal strength indication is provided to said microprocessor by said IF stage as an RSSI signal.

7. A method of conserving battery power in accordance with claim 5, wherein said RSSI signal inversely controls the quantity stored in said current control register.

8. A portable, power-conserving radiotelephone set adapted to receive an RF signal from an antenna and having a microprocessor and a low noise RF transistor receiving stage, comprising:

a. a first path to the base of said RF transistor receiving stage for applying said RF signal from said antenna; and b. a second path to the base of said transistor for applying from said microprocessor in parallel with but isolated from said RF signal a stored signal indicating received RF signal strength.

9. A portable, power-conserving radiotelephone set according to claim 8 further comprising a circuit for coupling an indication of said transistor's collector current to said microprocessor.

* * * * *